(12) United States Patent
Wu et al.

(10) Patent No.: US 6,919,247 B1
(45) Date of Patent: Jul. 19, 2005

(54) METHOD OF FABRICATING A FLOATING GATE

(75) Inventors: Yider Wu, Campbell, CA (US); Kuo-Tung Chang, Saratoga, CA (US)

(73) Assignee: Advanced Micro Devices, Santa Clara, CA (US)

( * ) Notice: Subject to any disclaimer, the term of this patent is extended or adjusted under 35 U.S.C. 154(b) by 0 days.

(21) Appl. No.: 10/655,936

(22) Filed: Sep. 4, 2003

(51) Int. Cl.[7] .......................................... H01L 21/8247
(52) U.S. Cl. ...................... 438/260; 438/657; 438/660
(58) Field of Search ................................ 438/257, 260, 438/264, 594, 657, 660, 910

(56) References Cited

U.S. PATENT DOCUMENTS

| | | | | |
|---|---|---|---|---|
| 4,914,046 A | * | 4/1990 | Tobin et al. ................. | 438/592 |
| 5,817,547 A | * | 10/1998 | Eom ........................... | 438/660 |
| 5,981,364 A | * | 11/1999 | Ramsbey et al. ............ | 438/592 |
| 6,211,046 B1 | * | 4/2001 | Sekikawa et al. ........... | 438/586 |
| 2002/0086503 A1 | * | 7/2002 | Schuegraf et al. .......... | 438/532 |

* cited by examiner

*Primary Examiner*—Chandra Chaudhari

(57) ABSTRACT

A method of fabricating a floating gate for a semiconductor device is disclosed and provided. According to this method, an undoped polycrystalline silicon layer is deposited on a tunnel oxide layer. The undoped polycrystalline silicon layer has a first thickness. Moreover, a doped polycrystalline silicon layer is deposited on the undoped polycrystalline silicon layer. The doped polycrystalline silicon layer has a second thickness. The undoped polycrystalline silicon layer and the doped polycrystalline silicon layer form the floating gate having a third thickness. In an embodiment, the semiconductor device is a flash memory device.

14 Claims, 7 Drawing Sheets

After thermal processes have been performed

METHOD OF FABRICATING A FLOATING GATE

BACKGROUND OF THE INVENTION

1. Field of the Invention

The present invention generally relates to semiconductor fabrication processes. More particularly, the present invention relates to the field of fabricating floating gates for semiconductor devices.

2. Related Art

Semiconductor fabrication processes have made possible the fabrication of advanced integrated circuits on a semiconductor wafer. These semiconductor fabrication processes are complex, requiring extensive control and care to avoid fabricating defective integrated circuits. As the size of the advanced integrated circuits is reduced, new fabrication issues arise when utilizing semiconductor fabrication processes designed for fabricating larger scaled advanced integrated circuits.

In particular, the reduction in size of semiconductor devices such as flash memory devices has resulted in fabrication problems. Typically, the flash memory device includes a stacked gate structure, a source, and a drain. The stacked gate includes a tunnel oxide layer, a floating gate layer for storing charge, an ONO (Oxide-Nitride-Oxide) layer, and a control gate layer for programming and erasing the flash memory device.

FIG. 1A illustrates a conventional fabrication process for forming the floating gate of the flash memory device 100. As depicted in FIG. 1A, the floating gate 9 is formed by depositing a doped polycrystalline silicon layer 9 on the tunnel oxide layer Tox which is formed on the surface of the semiconductor substrate 2. The doped polycrystalline silicon layer 9 includes a dopant material such as an N-type dopant material. Additional semiconductor processes are performed to form the stacked gate structure, the source, and the drain of the flash memory device 100. Moreover, a plurality of thermal processes are performed on the flash memory device 100. These thermal processes include an oxidation process and an anneal process.

The flash memory device 100 of FIG. 1A is shown after the plurality of thermal processes have been performed in FIG. 1B. As depicted in FIG. 1B, the floating gate 9 has a grain structure comprising a short number of grains 6A–6C comprised of doped polycrystalline silicon. Here, there are three grains 6A, 6B, and 6C. Each grain 6A–6C has a different orientation with respect to the tunnel oxide layer Tox. The grains 6A–6C are separated by grain boundaries 5. Moreover, each grain 6A–6C is large with respect to the size of the floating gate 9.

At the floating gate/tunnel oxide interface, the plurality of thermal processes causes the tunnel oxide layer Tox to grow via an oxidation process. The oxidation rate with respect to each grain 6A–6C is different. As shown in FIG. 1B, the oxidation rate at the grain 6A/tunnel oxide Tox interface is larger than the oxidation rates at the grain 6B/tunnel oxide Tox interface or the grain 6C/tunnel oxide Tox interface. Hence, at the grain 6A/tunnel oxide Tox interface, the thickness of the tunnel oxide Tox is significantly larger than at the grain 6B/tunnel oxide Tox interface or at the grain 6C/tunnel oxide Tox interface. The dashed area 3 demonstrates that there is a significant encroachment of the tunnel oxide Tox into the grain 6A of the floating gate 9.

As a result, the tunnel oxide Tox does not have a uniform thickness. This degrades the performance of the flash memory device 100 and impairs control of the flash memory device 100.

SUMMARY OF THE INVENTION

A method of fabricating a floating gate for a semiconductor device is disclosed and provided. According to this method, an undoped polycrystalline silicon layer is deposited on a tunnel oxide layer. The undoped polycrystalline silicon layer has a first thickness. Moreover, a doped polycrystalline silicon layer is deposited on the undoped polycrystalline silicon layer. The doped polycrystalline silicon layer has a second thickness. The undoped polycrystalline silicon layer and the doped polycrystalline silicon layer form the floating gate having a third thickness. In an embodiment, the semiconductor device is a flash memory device.

These and other advantages of the present invention will no doubt become apparent to those of ordinary skill in the art after having read the following detailed description of the preferred embodiments, which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

A method of fabricating a floating gate for a semiconductor device is disclosed and provided. In an embodiment, the semiconductor device is a flash memory device.

Figure 2:
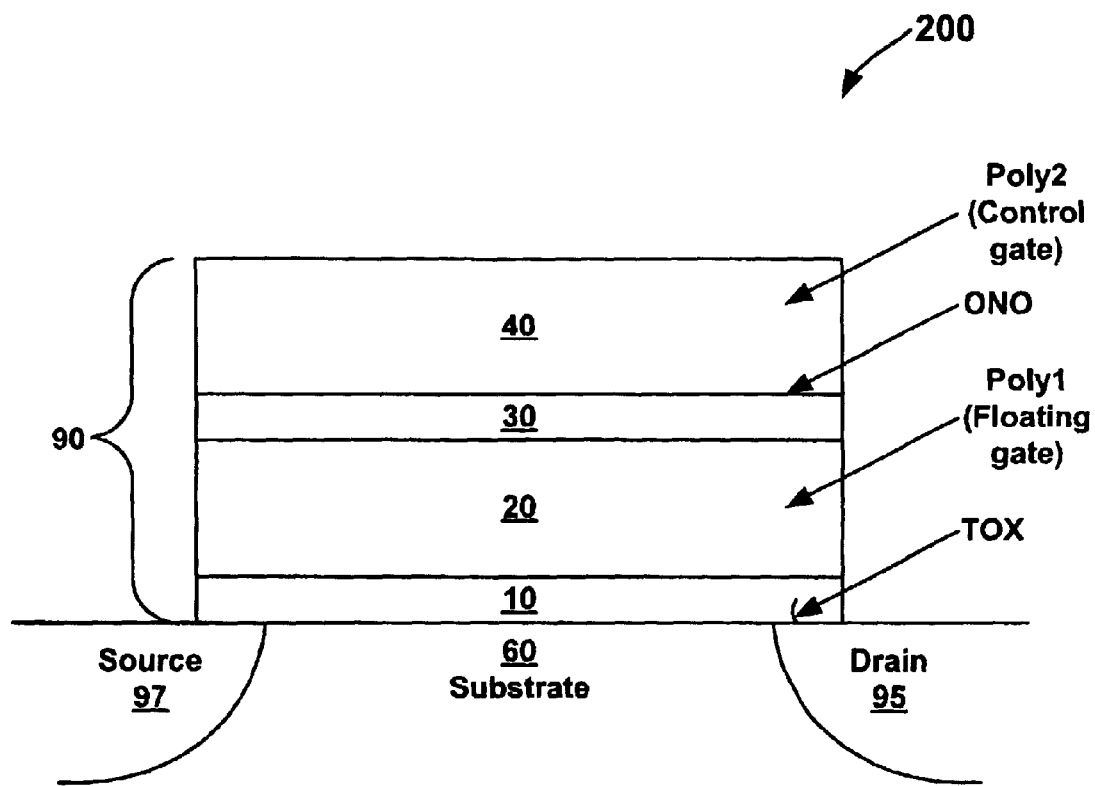
FIG. 2 illustrates a flash memory device in accordance with an embodiment of the present invention, showing a stacked gate structure.

FIG. 2 illustrates a flash memory device 200 in accordance with an embodiment of the present invention, showing a stacked gate structure 90. The method of the present invention is utilized to fabricate the flash memory device 200 such that a tunnel oxide layer 10 has a uniform thickness after completion of the semiconductor fabrications processes.

As shown in FIG. 2, the flash memory device 200 is fabricated on a semiconductor substrate 60. Typically, the semiconductor substrate 60 is comprised of silicon which is doped with a dopant material such as a P-type dopant or an N-type dopant. The flash memory device 200 includes a stacked gate structure 90, a doped source node 97, and a doped drain node 95. The flash memory device 200 is typically operated with the doped source node 97 coupled to ground while a gate voltage $V_g$ is applied to the stacked gate structure 90 and a drain voltage $V_g$ is applied to the doped drain node 95.

In an embodiment, the stacked gate structure 90 includes a tunnel oxide layer 10 (or Tox) and a floating gate layer 20 comprised of a first polycrystalline silicon (Poly 1) that is doped with a dopant material. Formation of the floating gate layer 20 will be described in detail below. Rather than forming the floating gate layer 20 by depositing a single layer of a first polycrystalline silicon (Poly 1) that is doped with a dopant material, the floating gate layer 20 is formed by depositing a first undoped polycrystalline silicon layer (undoped Poly 1) and then depositing a first doped polycrystalline silicon layer (doped Poly 1).

Figure 3:
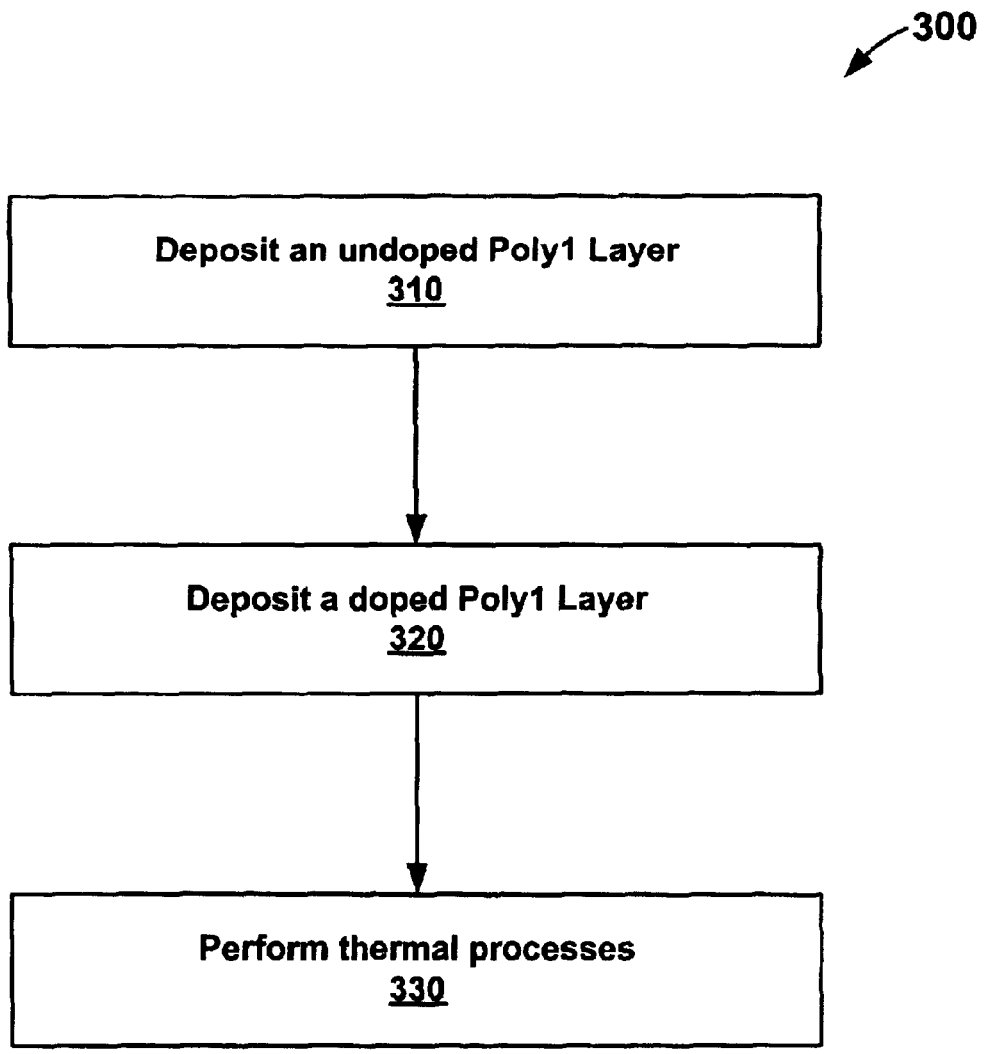
FIG. 3 illustrates a flow chart showing a method of fabricating a floating gate for a semiconductor device in accordance with an embodiment of the present invention.
Figure 4A:
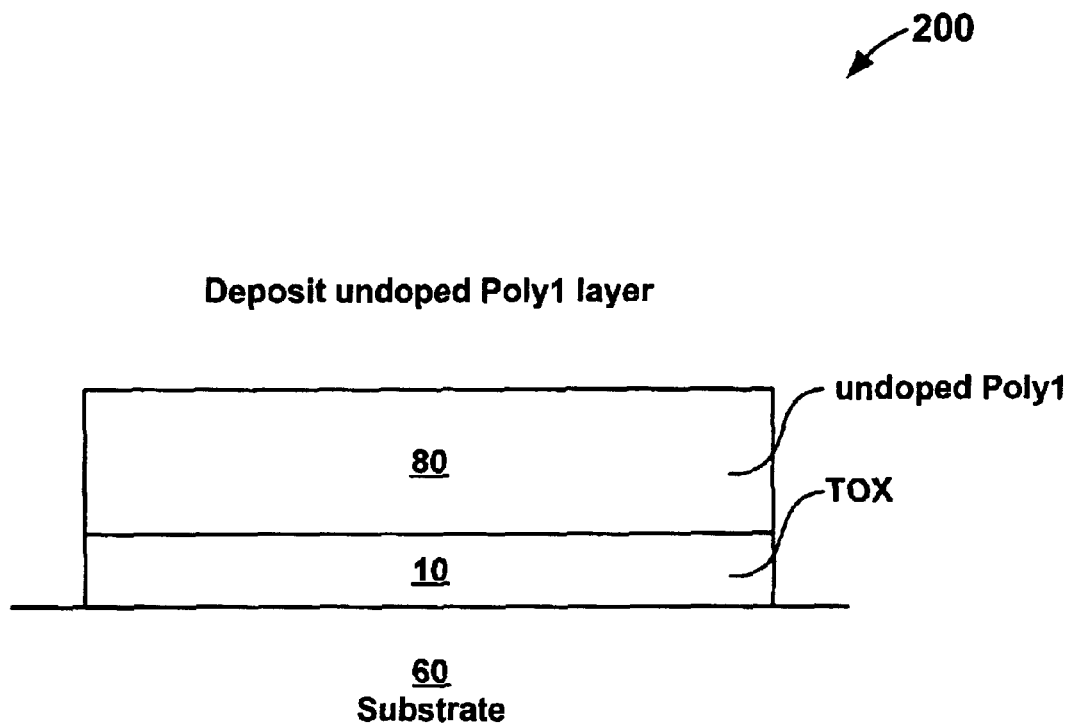
FIGS. 4A–4C illustrate semiconductor fabrication processes in accordance with an embodiment of the present invention.
Figure 4B:
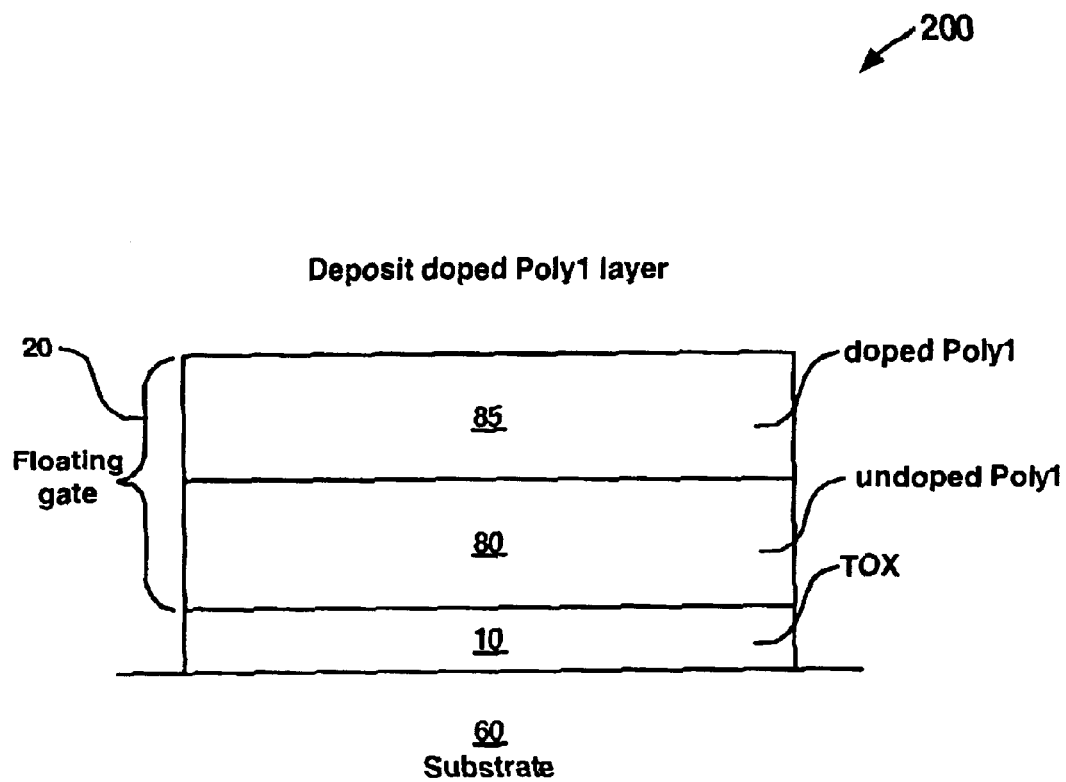
Figure 4C:
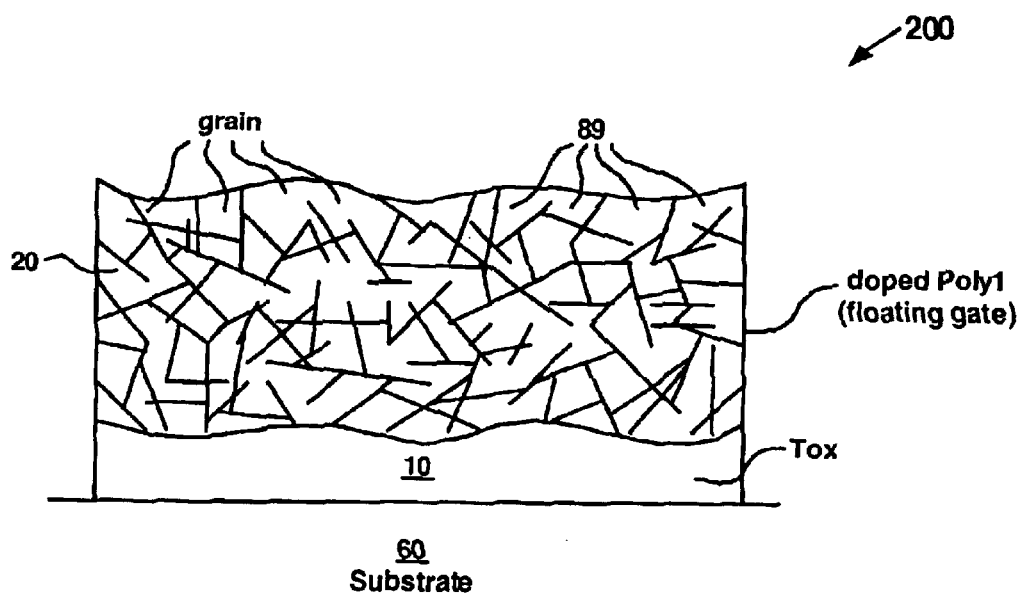

The stacked gate structure 90 further includes an ONO (Oxide-Nitride-Oxide) layer 30 and a control gate layer 40 comprised of a second polycrystalline silicon (Poly 2). The second polycrystal line silicon (Poly 2) may be doped with a dopant material. The oxide for the tunnel oxide layer of and the ONO layer 30 can be a dielectric such as silicon dioxide, silicon oxynitride, or any other high-k dielectric used in semiconductor fabrication. The thickness of the tunnel oxide layer 10, the floating gate layer 20, the ONO layer 30, and the control gate layer 40 can be a variety of values. Moreover, the length of the stacked gate structure 90 may be a variety of values. FIG. 3 illustrates a flow chart showing a method 300 of fabricating a floating gate 20 for a semiconductor device in accordance with an embodiment of the present invention. In an embodiment, the semiconductor device is a flash memory device 200. Reference is made to FIGS. 4A–4C.

At step 310, a first undoped polycrystalline silicon layer 80 (FIG. 4A) is deposited on the tunnel oxide layer 10, whereas the tunnel oxide layer 10 is formed on the surface of the semiconductor substrate 60. FIG. 4A depicts the first undoped polycrystalline silicon layer 80. Low pressure chemical vapor deposition can be used to deposit the first undoped polycrystalline silicon layer 80. The first undoped polycrystalline silicon layer 80 has a first thickness.

Moreover, at step 320, a first doped polycrystalline silicon layer 85 (FIG. 4B) is deposited on first undoped polycrystalline silicon layer 80. FIG. 4B depicts the first doped polycrystalline silicon layer 85. Low pressure chemical vapor deposition can be used to deposit the first doped polycrystalline silicon layer 85. The first doped polycrystalline silicon layer 85 has a second thickness. In an embodiment, the first doped polycrystalline silicon layer 85 includes an N-type dopant material. The N-type dopant material can be phosphorous.

As depicted in FIG. 4B, the first undoped polycrystalline silicon layer 80 and first doped polycrystalline silicon layer 85 together form and represent the floating gate 20. The floating gate 20 has a third thickness, whereas the third thickness is approximately the sum of the first thickness (of the first undoped polycrystalline silicon layer 80) and the second thickness (of the first doped polycrystalline silicon layer 85). Additional semiconductor processes (not shown) are performed to form the ONO layer 30 and the control gate 40 of the stacked gate structure 90 (FIG. 2), the source 97 (FIG. 2), and the drain 95 (FIG. 2) of the flash memory device 200.

Continuing with FIG. 3, at step 330, a plurality of thermal processes are performed on the flash memory device 200 during its fabrication. These thermal processes include an oxidation process and an anneal process. The thermal processes affect the floating gate 20 and the tunnel oxide 10. For instance, the dopant material of the first doped polycrystalline silicon layer 85 diffuses into the first undoped polycrystalline silicon layer 80, creating a single region of doped polycrystalline silicon.

FIG. 4C depicts the flash memory device 200 after a plurality of thermal processes have been performed in accordance with an embodiment of the present invention. As shown in FIG. 4C, the floating gate 20 has a grain structure comprising a plurality of grains 89. Each grain 89 is comprised of doped polycrystalline silicon. Compared to the grains 6A–6C (FIG. 1B) of the conventional floating gate 9 (FIG. 1B), the grains 89 of the floating gate 20 are much smaller and are more numerous.

Figure 1A:
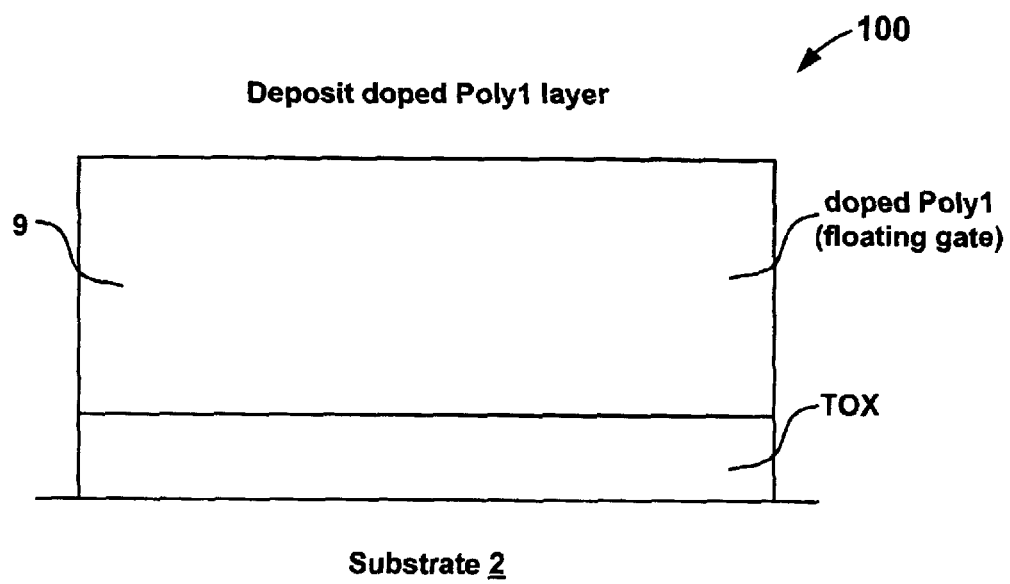
FIG. 1A illustrates a conventional fabrication process for forming a floating gate of a flash memory device.
Figure 1B:
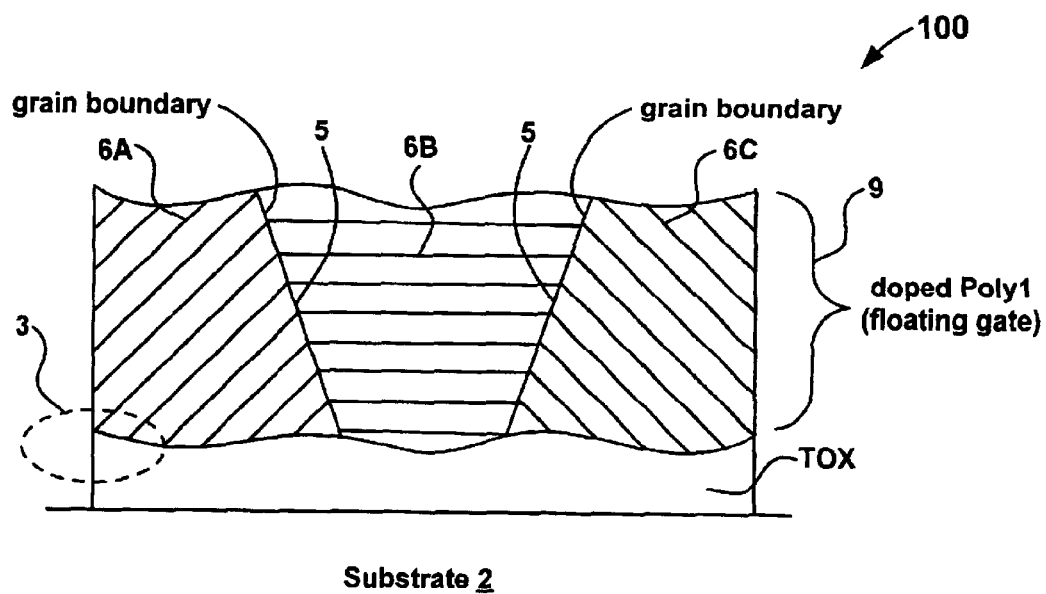
FIG. 1B illustrates the flash memory device of FIG. 1A after a plurality of thermal processes have been performed.

As described above, the plurality of thermal processes causes the tunnel oxide layer 10 to grow via an oxidation process at the floating gate/tunnel oxide interface. The oxidation rate with respect to each grain 89 of the floating gate 20 is different. Since the grains 89 of the floating gate 20 are smaller than the grains 6A–6C of the floating gate 9 (FIG. 1B), the oxidation rates at the floating gate/tunnel oxide interface of the floating gate 20 are slower than the oxidation rates at the floating gate/tunnel oxide interface of the floating gate 9 (FIG. 1B). Because the oxidation rates are slower, there is significantly less encroachment of the tunnel oxide 10 into the grains 89 of the floating gate 20 compared to the encroachment of the tunnel oxide Tox (FIG. 1B) into the grains 6A–6C of the floating gate 9 (FIG. 1B). Also, due to the smaller grain size, the non-uniformity from oxidation among flash memory devices would be minimized.

Thus, the tunnel oxide 10 (FIG. 4C) has a thickness that is significantly more uniform than the thickness of the tunnel oxide Tox (FIG. 1B). This improves the performance of the flash memory device 200 and enables control of the flash memory device 200.

As described above, the first undoped polycrystalline silicon layer 80 has a first thickness while the first doped polycrystalline silicon layer 85 has a second thickness. The floating gate 20 has a third thickness, whereas the third thickness is approximately the sum of the first thickness (of the first undoped polycrystalline silicon layer 80) and the second thickness (of the first doped polycrystalline silicon layer 85). The thickness of the first undoped polycrystalline silicon layer 80 is selected to be a particular percentage of the desired thickness of the floating gate 20. For example, the first thickness (of the first undoped polycrystalline silicon layer 80) can be approximately one third of the third thickness (of the floating gate 20) while the second thickness (of the first doped polycrystalline silicon layer 85) can be approximately two thirds of the third thickness (of the floating gate 20). Additionally, the first thickness (of the first undoped polycrystalline silicon layer 80) can be approximately fifty percent of the third thickness (of the floating gate 20) while the second thickness (of the first doped polycrystalline silicon layer 85) can be approximately fifty percent of the third thickness (of the floating gate 20). The thickness of the floating gate 20 can be distributed between the first undoped polycrystalline silicon layer 80 and first doped polycrystalline silicon layer 85 according to other percentages.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a floating gate for a semiconductor device, said method comprising:

depositing an undoped polycrystalline silicon layer on a tunnel oxide layer, wherein said undoped polycrystalline silicon layer has a first thickness;

depositing a doped polycrystalline silicon layer on said undoped polycrystalline silicon layer, wherein said doped polycrystalline silicon layer has a second thickness, and wherein said undoped polycrystalline silicon layer and said doped polycrystalline silicon layer form said floating gate having a third thickness, wherein said doped polycrystalline silicon layer includes dopant material throughout said second thickness; and performing a plurality of thermal processes such that said floating gate comprises a plurality of grains, each grain being smaller than the grains of a floating gate formed using only doped polycrystalline silicon.

2. The method as recited in claim 1 wherein said doped polycrystalline silicon layer includes an N-type dopant material.

3. The method as recited in claim 2 wherein N-type dopant material is phosphorous.

4. The method as recited in claim 1 wherein said third thickness is approximately a sum of said first thickness and said second thickness.

5. The method as recited in claim 1 wherein said first thickness is approximately one third of said third thickness, and wherein said second thickness is approximately two thirds of said third thickness.

6. The method as recited in claim 1 wherein said first thickness is approximately fifty percent of said third thickness, and wherein said second thickness is approximately fifty percent of said third thickness.

7. The method as recited in claim 1 wherein said semiconductor device is a flash memory device.

8. A method of fabricating a stacked gate structure for a semiconductor device, said method comprising:

forming a tunnel oxide layer on a surface of a semiconductor substrate;

depositing an undoped polycrystalline silicon layer on said tunnel oxide layer, wherein said undoped polycrystalline silicon layer has a first thickness;

depositing a doped polycrystalline silicon layer on said undoped polycrystalline silicon layer, wherein said doped polycrystalline silicon layer has a second thickness, and wherein said undoped polycrystalline silicon layer and said doped polycrystalline silicon layer form a floating gate having a third thickness, wherein said doped polycrystalline silicon layer includes dopant material throughout said second thickness;

performing a plurality of thermal processes such that said floating gate comprises a plurality of grains, each grain being smaller than the grains of a floating gate formed using only doped polycrystalline silicon;

forming a ONO (Oxide-Nitride-Oxide) layer on said floating gate; and forming a control gate on said ONO layer.

9. The method as recited in claim 8 wherein said doped polycrystalline silicon layer includes an N-type dopant material.

10. The method as recited in claim 9 wherein N-type dopant material is phosphorous.

11. The method as recited in claim 8 wherein said third thickness is approximately a sum of said first thickness and said second thickness.

12. The method as recited in claim 8 wherein said first thickness is approximately one third of said third thickness, and wherein said second thickness is approximately two thirds of said third thickness.

13. The method as recited in claim 8 wherein said first thickness is approximately fifty percent of said third thickness, and wherein said second thickness is approximately fifty percent of said third thickness.

14. The method as recited in claim 8 wherein said semiconductor device is a flash memory device.

* * * * *